United States Patent
Xue et al.

(10) Patent No.: US 9,293,368 B2
(45) Date of Patent: Mar. 22, 2016

(54) METHOD FOR REMOVING ELECTROPLATED METAL FACETS AND REUSING A BARRIER LAYER WITHOUT CHEMICAL MECHANICAL POLISHING

(71) Applicant: National Center for Advanced Packaging Co., Ltd., Wuxi, Jiangsu (CN)

(72) Inventors: Kai Xue, Wuxi (CN); Daquan Yu, Wuxi (CN)

(73) Assignee: National Center for Advanced Packaging Co., Ltd., Wuxi, Jiangsu (CN)

( * ) Notice: Subject to any disclaimer, the term of this patent is extended or adjusted under 35 U.S.C. 154(b) by 0 days.

(21) Appl. No.: 14/483,894

(22) Filed: Sep. 11, 2014

(65) Prior Publication Data

US 2015/0072516 A1 Mar. 12, 2015

(30) Foreign Application Priority Data

Sep. 11, 2013 (CN) .......................... 2013 1 0412558

(51) Int. Cl.
*H01L 21/768* (2006.01)
*H01L 23/00* (2006.01)
*H01L 21/321* (2006.01)

(52) U.S. Cl.
CPC .... *H01L 21/76898* (2013.01); *H01L 21/32115* (2013.01); *H01L 21/32125* (2013.01); *H01L 21/76841* (2013.01); *H01L 24/03* (2013.01); *H01L 21/7684* (2013.01); *H01L 24/05* (2013.01); *H01L 24/13* (2013.01); *H01L 2224/02372* (2013.01); *H01L 2224/02377* (2013.01); *H01L 2224/0391* (2013.01); *H01L 2224/03462* (2013.01); *H01L 2224/03914* (2013.01);

(Continued)

(58) Field of Classification Search
CPC ..................... H01L 21/76841; H01L 2224/26; H01L 2224/13147; H01L 21/76898; H01L 21/32115; H01L 2224/1134; H01L 21/7684; H01L 2224/05548; H01L 2224/02372; H01L 2224/03914; H01L 2224/05647; H01L 2224/03462
USPC .......................... 438/612–614, 666–667, 687
See application file for complete search history.

(56) References Cited

U.S. PATENT DOCUMENTS 6,679,980 B1 1/2004 Andreacchi
2007/0045780 A1* 3/2007 Akram et al. ................. 257/621

FOREIGN PATENT DOCUMENTS

EP 1382065 A1 1/2004

OTHER PUBLICATIONS

Office action for Chinese patent application serial No. 201310412558.6, mailed Jan. 19, 2015.

(Continued)

*Primary Examiner* — Thanhha Pham
(74) *Attorney, Agent, or Firm* — Goodwin Procter LLP

(57) ABSTRACT

A method for avoiding using CMP for eliminating electroplated copper facets and reusing barrier layer in the back end of line ("BEOL") manufacturing processes. Electropolishing is employed to remove the deposited surface metal, stopping at the barrier layer to form a smooth surface that may be utilized in subsequent steps. The method is suitable for the electropolishing of metal surfaces after formation of filled vias for through-silicon via processes employing metals such as copper, tungsten, aluminum, or alloys thereof. The remaining barrier layer may be reused to fabricate the redistribution layer.

14 Claims, 7 Drawing Sheets

(52) U.S. Cl.
CPC ............... *H01L2224/0401* (2013.01); *H01L 2224/05548* (2013.01); *H01L 2224/05567* (2013.01); *H01L 2224/05647* (2013.01); *H01L 2224/1134* (2013.01); *H01L 2224/13022* (2013.01); *H01L 2224/13024* (2013.01); *H01L 2924/00014* (2013.01); *H01L 2924/12042* (2013.01)

(56) References Cited

OTHER PUBLICATIONS

H. Surmann, "Automatiserter Entwurf von Fuzzy Systemem", VDI Verlag (1995) Series 8, No. 452.

\* cited by examiner

METHOD FOR REMOVING ELECTROPLATED METAL FACETS AND REUSING A BARRIER LAYER WITHOUT CHEMICAL MECHANICAL POLISHING

PRIOR APPLICATION

This application claims priority to CN 201310412558.6, filed Sep. 11, 2013, the entire contents of which are incorporated by reference herein.

FIELD OF THE INVENTION

Embodiments of the invention relate generally to semiconductor device packaging technology, particularly to a process of removing electroplated metal facets, such as copper facets.

BACKGROUND OF THE INVENTION

Many different electropolishing processes may be used for the processing of various metals and its alloy. The purpose of the process of electrochemical polishing or electropolishing is to produce metal surfaces of high purity, and to smooth and deburr the metal surfaces. Smoothing in the micro range can also produce gloss in the treated wafer surfaces. Furthermore, electropolishing can also remove any stresses from the outer layers of the metal layers.

The electroplating deposition ("ECD") of copper is the main technology for through-silicon via ("TSV") filling in advanced packaging. In the ECD process, rapid deposition of copper requires the prior formation of barrier and seed layers. Then, chemical mechanical polishing ("CMP") is used to removing the copper overburden on the wafer. The redistribution layer is typically formed after these steps. Due to the high cost of CMP equipment and slurry consumption, one cannot significantly decreasing the cost of the total process that includes a CMP step.

The patent EP1382065 "Electropolishing metal layers on wafers having trenches or vias with dummy structure" appears to disclose an electropolishing technology in a dual-damascene process. The method of forming copper interconnect in the front end of line semiconductor procedure is presented. But the patent does not appear to address removing copper facets formed by electroplating, and does not suggest barrier layer reuse.

An appreciable obstacle to the removal of overburden copper facets is the difficulty of smoothing and deburring the metal layer surface in semiconductor manufacturing in recent years. This is due to the difficulty in volatilizing the compound formed during inductively coupled plasma ("ICP") etching processes. CMP of such surfaces is rather expensive and may produce stress in the surface structure of the wafer, which can have an adverse effect on the corrosion resistance of the wafer. The barrier layer, instead of being recycled for use in the subsequent step, is removed in the CMP process. Accordingly, the CMP produces waste and may be harmful to the environment.

Electrochemical polishing of metal surfaces in semiconductor manufacturing is one alternative. U.S. Pat. No. 6,679,980B1 presents an electropolishing process that can be used for a metal and its alloy layer, which consists of cobalt-chromium-tungsten. As described in H. Surmann, "Automatiserter Entwurf von Fuzzy Systemen", VDI Verlag (1995) Series 8, No. 452, the papers presented in this field concentrate primarily on special equipment and control systems of the electropolishing process.

SUMMARY

Embodiments of the process of the invention allow the removal of irregularities as well as of stressed and damaged layers of material, and to obtain a barrier layer of high quality by electropolishing.

Embodiments of the present invention relate to resolving the disadvantage of available technology by removing the electroplated copper facets and reusing the barrier layer, through the enablement of the production of a smooth, level and deburred barrier layer surface. Taking advantage of electropolishing technology combined with a wet etch process to remove the surface overburden copper produced in previous ECD process and smoothing the exposed barrier layer allows the attainment of a perfect surface of the remaining barrier layer. This method enables the reuse of the barrier layer, thereby decreasing the integration process cost.

In an aspect, embodiments of the invention relate to a method for forming a filled blind via that may be used to subsequently form a through-silicon via. The method includes defining a blind via in a substrate. An insulation layer is deposited over the substrate and in the blind via. A barrier layer comprising a first metal and a seed layer comprising a second metal are formed over the insulation layer, with the barrier layer and seed layer extending into the blind via. A third metal layer is formed over the barrier and seed layers, filling the blind via. Overburden metal facets disposed outside the blind via are removed by electropolishing, the overburden metal facets including the second and third metals, to expose the barrier layer disposed over the wafer surface and to define a smooth surface. A first redistribution layer is formed over the exposed barrier layer. The barrier layer is patterned by removing portions of the barrier layer extending beyond the patterned first redistribution layer.

One or more of the following features may be included. The blind via may be defined by deep reactive ion etching. The insulation layer may include a material such as an oxide, a nitride and/or a polymer. The first metal may include, e.g., Ti, Ta, TiN, TaN, W, WN, V, VN, Nb, and/or NbN. The second metal may include, e.g., copper, tungsten, nickel, nickel boron, gold, and silver.

The third metal layer may include a metal such as, e.g., copper, tungsten, nickel, nickel boron, gold, and silver. Forming the third metal layer may include depositing copper by electrochemical deposition. Patterning the barrier layer may include performing a wet etch.

A dielectric layer may be formed over the first redistribution layer. The dielectric layer may include a low K dielectric, an oxide, spin-on glass, and/or a polymer.

The seed layer may be formed on the barrier layer prior to forming the third metal layer. The seed layer may be formed by depositing copper by physical vapor deposition.

An annealing step may be performed after forming the third metal layer.

The following additional steps may be performed: a dielectric layer may be provided over the redistribution layer, a via/trench defined in the dielectric layer, and a bump and joint plate fabricated over the via. The dielectric layer may include an oxide, nitride, spin-on glass, and/or a polymer. The via may be filled by at least one of electro chemical deposition or chemical vapor deposition.

Embodiments of the method of the invention may satisfy the requirements of TSV integration processes, decrease the cost of TSV processes, and lower the threshold of TSV technology industrialization and the cost of manufacture.

DETAILED DESCRIPTION

An exemplary method in accordance with an embodiment of the invention for removing electroplated metal, e.g., copper, facets and reusing the barrier layer includes the following steps.

As used herein, a through-silicon via is an electrical connection extending through a silicon or other semiconductor wafer or through a die.

Figure 1:
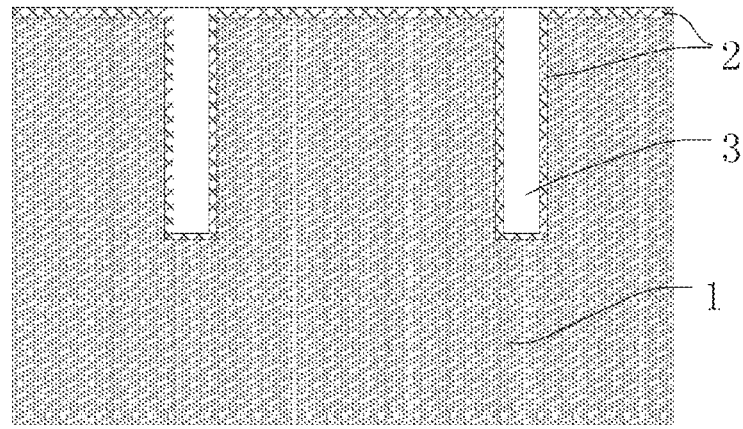
FIG. 1 illustrates the fabrication of a blind via and formation of an insulation layer on a wafer.

Referring to FIG. 1, in step S1, a substrate, such as a silicon wafer 1, is provided. A blind via i.e., a via such as a TSV, is defined in the wafer. The blind via depth and diameter are set according to specific requirement. The blind via with the vertical sidewall may be defined by, e.g., deep reactive-ion etching ("DRIE") or laser drilling. Generally the ratio of depth to diameter is at least 3:1.

Thereafter, an insulation layer 2 is deposited on the wafer 1, lining the blind via. The insulation layer may include, for example, silicon dioxide, silicon nitride, silicon oxynitride, an organic polymer, et cetera. The insulation layer may include a single layer or multiple layers, having a thickness of, e.g., 10 nanometers to 3 micrometers The insulation layer is formed by, e.g., plasma-enhanced chemical vapor deposition ("PECVD"), over the wafer surface and lining the via. The insulation layer isolates the copper in TSV from the silicon substrate, thereby reducing the probability of occurrence of electrical shorts.

Figure 2:
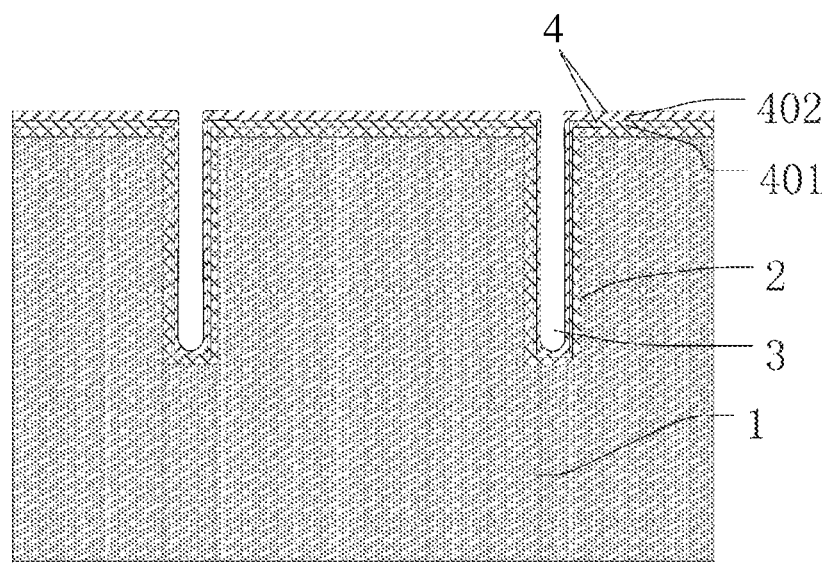
FIG. 2 illustrates the fabrication of the barrier layer and seed layer on the structure of FIG. 1.

Referring to FIG. 2, in step S2, a barrier layer 401 and a seed layer 402 are deposited on the insulation layer 2 over the wafer surface and in the blind via. The barrier and seed layers may be formed by, e.g., physical vapor deposition for example such as physical vapor deposition ("PVD") over the insulation layer on the wafer surface and lining the blind via. The seed layer is fabricated by metal deposition on the barrier layer. The barrier and seed layers together define a metal layer 4, with the seed layer 402 including sputtered metal disposed on the barrier layer 401. The barrier layer material includes a first metal such as, e.g., titanium, titanium nitride, tantalum nitride, tungsten, tungsten nitride, vanadium, vanadium nitride, niobium, niobium nitride, etc. The seed layer 402 includes a second metal that is preferably copper, but may also be, e.g., tungsten, nickel, nickel boron, gold, or silver.

Figure 3:
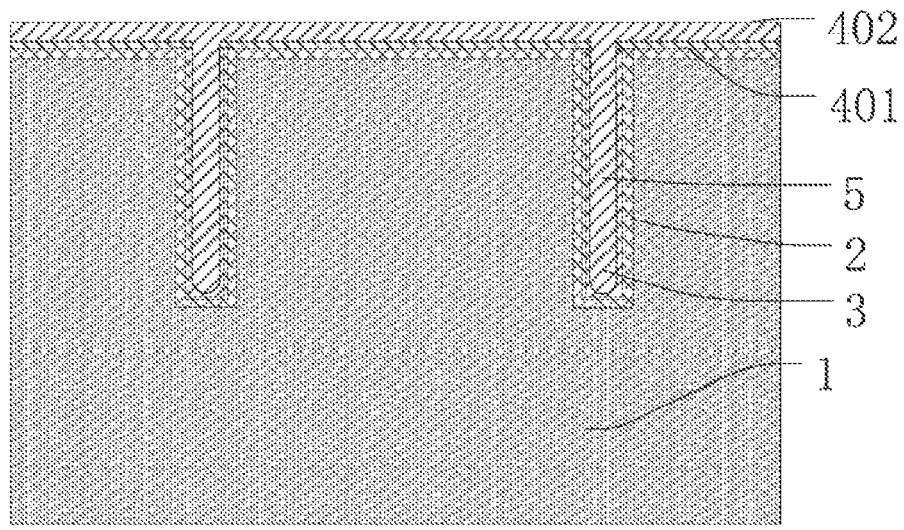
FIG. 3 illustrates the structure of FIG. 2 after the formation of the second metal material filling the blind via.

Referring to FIG. 3, in step S3, a third metallic material 5 is deposited by, e.g., an electroplating process. The blind via 3 may be filled by the third metallic material 5. Preferably, the third metallic material is the same metal as the seed layer 402, e.g., copper, tungsten, nickel, nickel boron, gold, or silver. The filling capability may be customized by varying organic and inorganic concentrations. Optimization of deposition conditions such as bath composition, waveform, bath temperature and flow condition, allows the via, e.g., the TSV, to be filled with little or no voids or seams.

Figure 4:
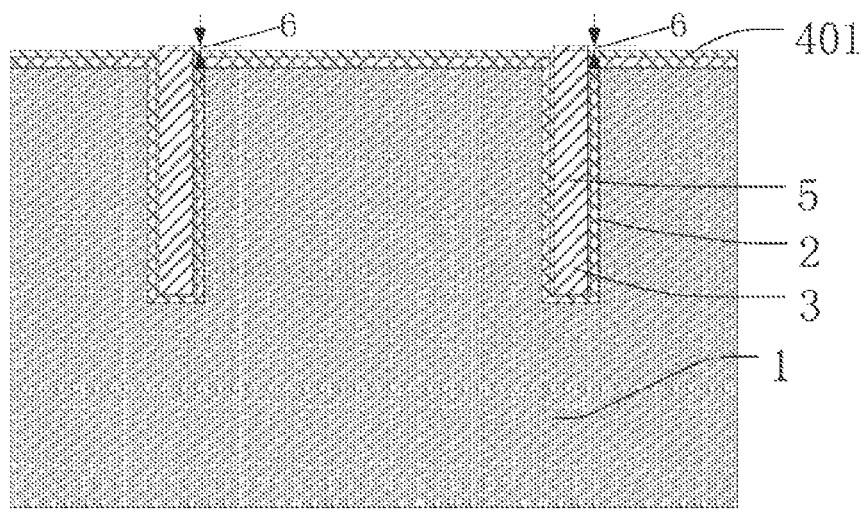
FIG. 4 illustrates the structure of FIG. 3 after removal of the seed layer from the wafer surface.

Referring to FIG. 4, in step S4, electropolishing technology may be used to remove the overburden metal facets, e.g., overburden copper, produced during the blind via filling process outside the blind via over the seed layer and over the wafer surface. The overburden facets include the second and third metals, i.e., portions of the seed layer and third metal layer. The electrolyte used for copper removal may be maintained in a temperature selected from a range of 20° C. to 50° C., which has been proven to be especially suitable. The electrolyte temperature control and monitoring can be performed in any manner known to one of skill in the art. The step height difference between the top of the filling metal material and the barrier layer may be controlled to range from, e.g., −3 micrometers to 3 micrometers.

The duration of the electropolishing process depends on the roughness of the wafer surface and the required target smoothing. The optimal process parameters can be determined by a person skilled in the art by routine experimentation with respect to electrolytic temperature, current density, material to be polished, composition of the electrolyte and of the electropolishing equipment used.

Other features of electropolishing technology known to persons of skill in the art may be utilized to produce high quality, microsmooth surfaces of the ECD metal and metal barrier layer.

The electrolyte may be reused, so the consumption cost of ownership can decrease 70% in comparison to CMP technology. Moreover, the difficulty of process integration may be reduced. The step height 6 between the third filled metal material and the barrier layer in the surface is preferably controlled to range from 3 micrometers to −3 micrometers.

Figure 5:
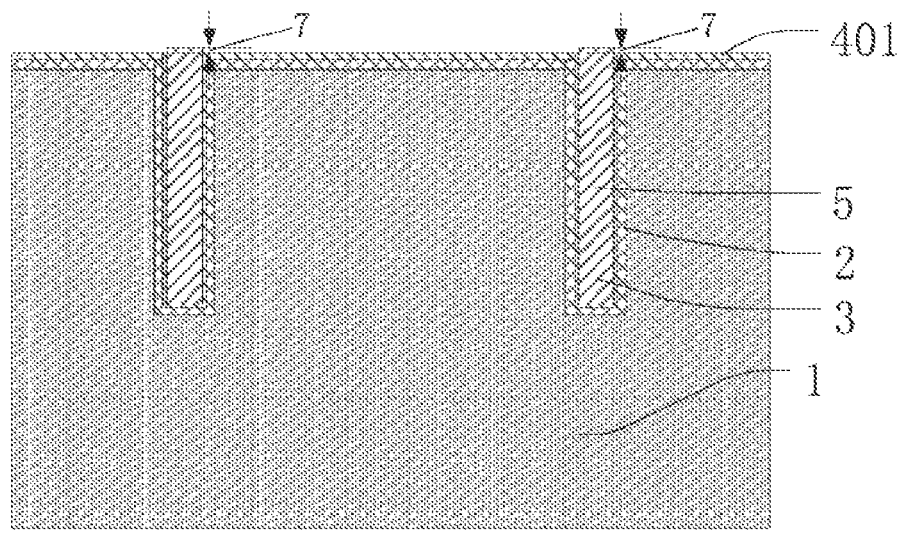
FIG. 5 illustrates the process of wafer annealing.

Referring to FIG. 5, in step S5, the wafer may undergo an annealing step in a vertical batch system in an inert gas, such as $N_2$, Ar, or a suitable gas mixture. The temperature variation rate may be controlled with a precision of better than ±1° C. The annealing results in the metal grain becoming stable. The annealing temperature may be selected from a range of 100 to 400° C. in an inert atmosphere. The heat treatment times may be selected from a range of 10 seconds to 300 minutes. It will be apparent to one skilled in the art that other suitable heating methods, such as infrared, microwave, laser lamp, scanning laser source or conventional hot plates or ovens may be used.

The annealing may cause deformation of the metal, thereby leading to a variation 7 in the step height.

Figure 6:
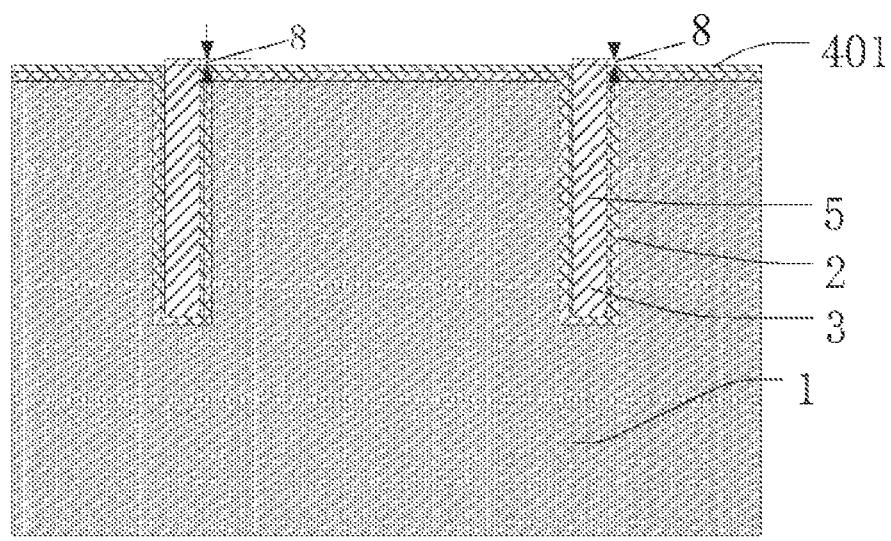
FIG. 6 illustrates the height modification step with respect to the second filled metal in the blind via and barrier layer.

Referring to FIG. 6, in step S6, since the electrolyte cannot dissolve the barrier layer 401 material, electropolishing may be used to modify the step height 8 between the third metal surface and the barrier layer, visibly reducing the step. The step height may approach 0 micrometers. The smaller step height facilitates the formation of a smoother distribution layer, leading to improved reliability. It may be desirable to electropolish the copper layer down to the barrier layer.

Following the electropolish of the overburden copper facet, the treated wafer after Step S6 is removed from the polishing electrolytic and typically rinsed with demineralized water, and dried by N2 if necessary.

Figure 7:
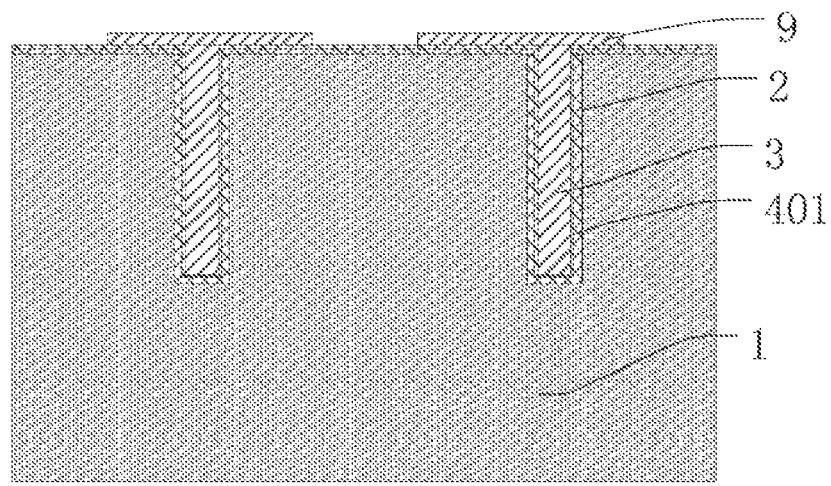
FIG. 7 illustrates the structure of FIG. 6 after formation of the first redistribution layer.

Referring to FIG. 7, in step S7, a first redistribution layer 9 is fabricated over the wafer surface, including over the barrier layer, reusing the barrier layer that was used in step S6, thereby not requiring the formation of a new barrier layer.

This includes deposition of the first redistribution layer by, e.g., electrochemical deposition. Typically, the redistribution layer material may include copper deposited by an ECD process. The redistribution layer may have a thickness selected from a range of 0.5 micrometers to 15 micrometers. The redistribution layer pattern may be defined by a lithographic process, including PVD formation of a titanium and copper layer, forming a photoresist coating, exposure, developing, electrochemical deposition, photoresist removal, and copper and titanium etching. In accordance with embodiments of the invention, the titanium layer is reused. The method differs from conventional CMP processes that require the removal of the barrier layer until the end reference point of the insulation layer is attained. Then, in a conventional process, the barrier layer is re-deposited before the redistribution layer made. Using methods in accordance with embodiments of the invention can decrease the total cost of processes integration and lower the time of manufacture.

Figure 8:
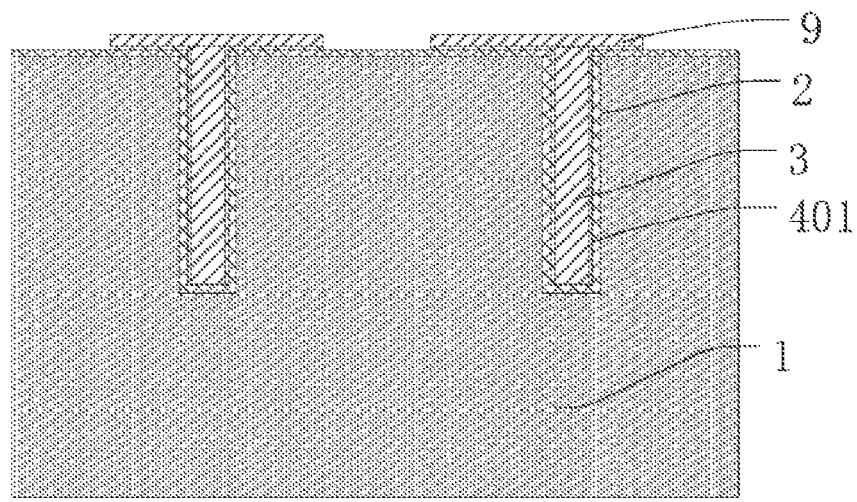
FIG. 8 illustrates the structure of FIG. 7 after patterning of the barrier layer.

Referring to FIG. 8, in step S8, the wet etch process may be used to remove the barrier layer disposed outside the area occupied by the first redistribution layer, thereby patterning the barrier layer. This process allows removing the electroplated copper facet without CMP by substituting a wet etch for CMP, and enabling the reuse of the barrier layer. Process costs are thereby reduced. The additional following steps may also be performed.

Figure 9:
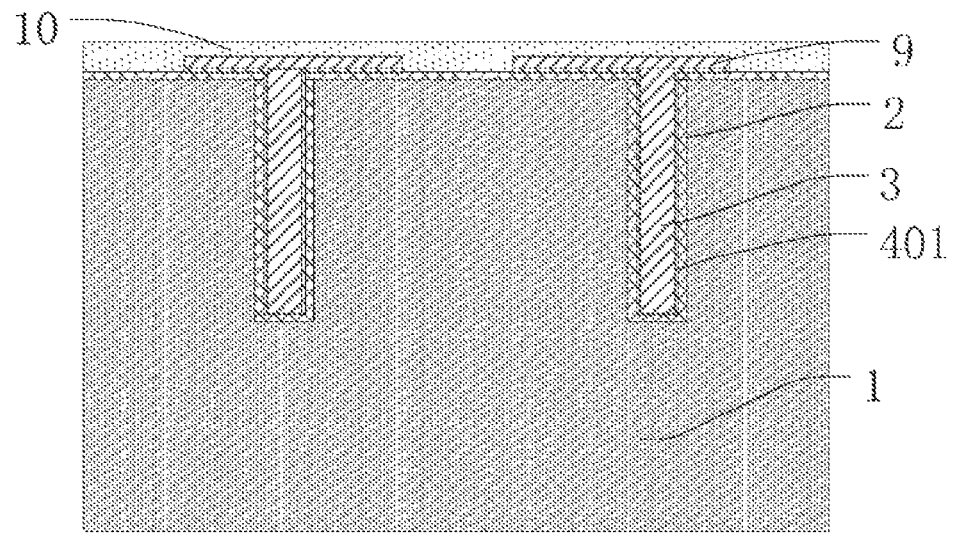
FIG. 9 illustrates the fabrication of the dielectric layer.

Referring to FIG. 9, in step S9, a dielectric layer 10 may be deposited over the wafer. The dielectric layer may be a low-k dielectric. The dielectric layer may be, e.g., polyimide ("PI"), polybenzoxazole ("PBO"), a polymer such as an organic polymeric material, a spin-on glass, and/or a doped oxide, silicon dioxide, silicon nitride or silicon oxynitride, etc. The dielectric layer may be formed by PECVD or spun onto the wafer surface.

Figure 10:
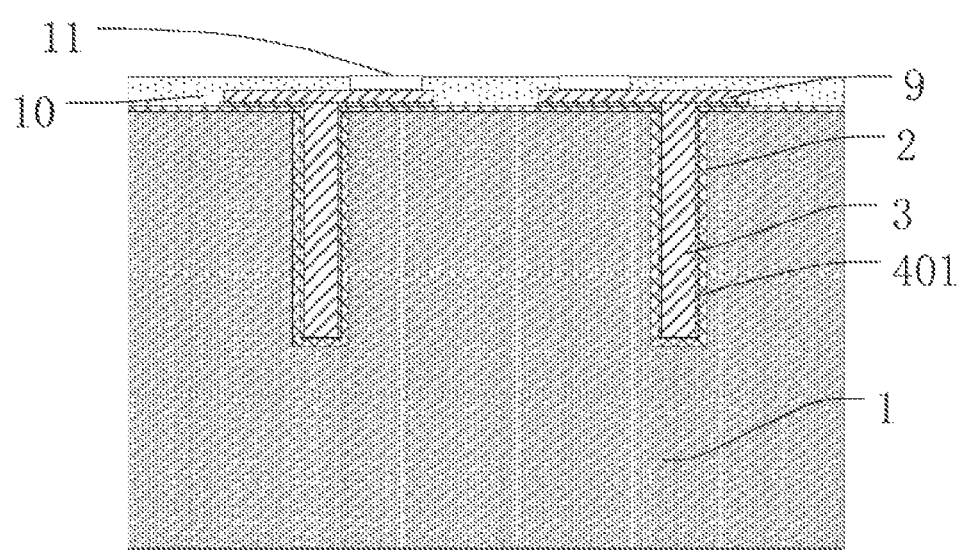
FIG. 10 illustrates the structure of FIG. 9 after a via is defined in the dielectric layer.

Referring to FIG. 10, in step S10, a via 11 may be made in the dielectric layer to provide a connection to the first distribution layer.

Figure 11:
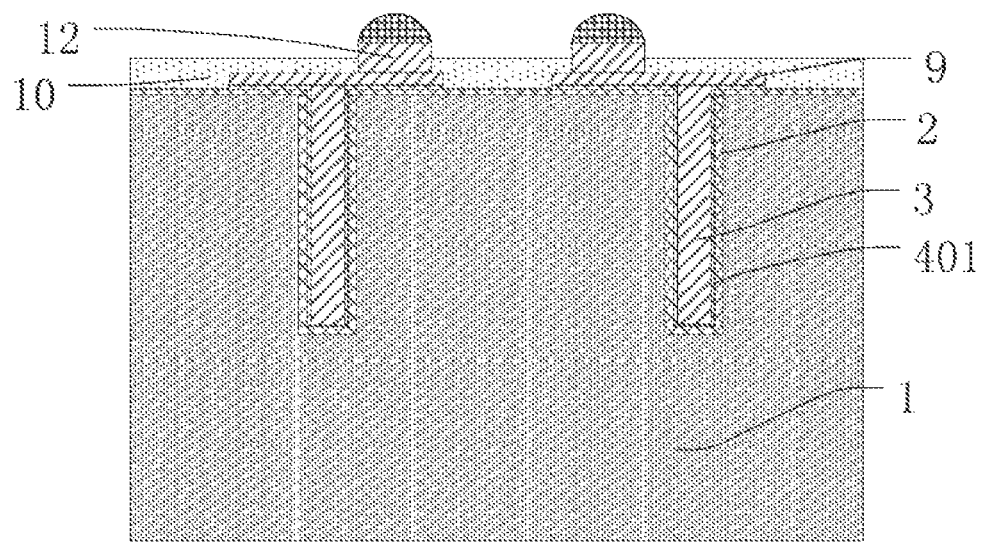
FIG. 11 illustrates the structure of FIG. 10 after fabrication of a micro bump and joint plate.
Figure 12:
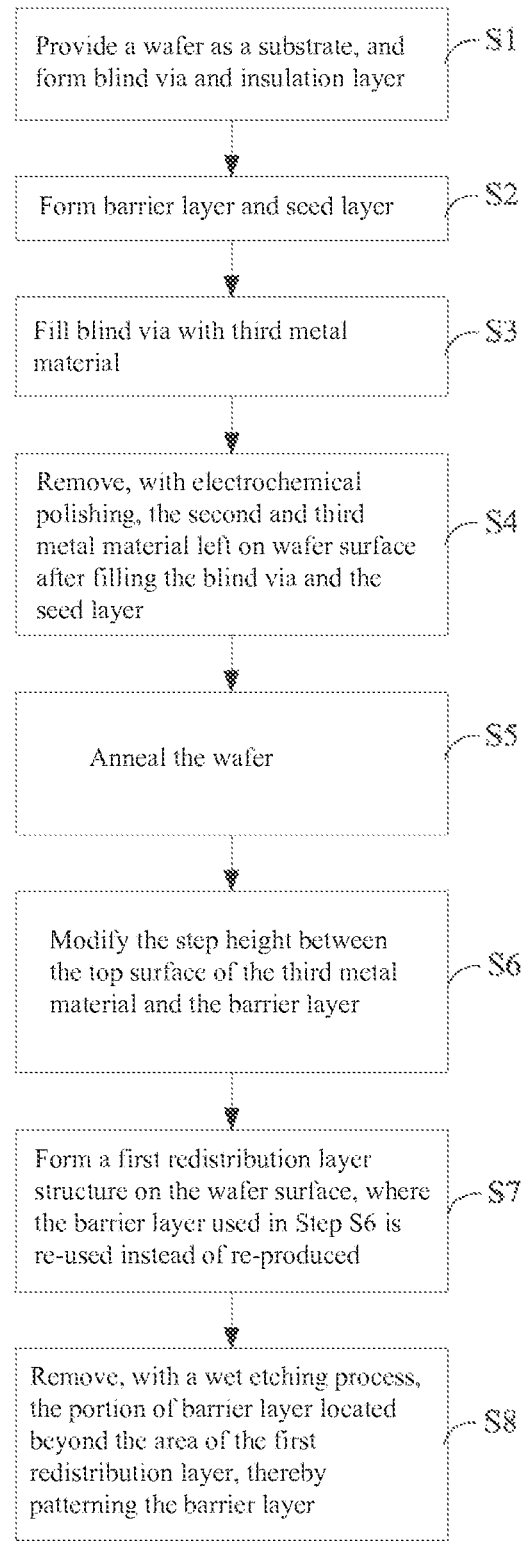
FIG. 12 illustrates the flow chart of a process in accordance with an embodiment of the invention.

Referring to FIG. 11, in step S11, a micro-bump and joint plate may be fabricated over the wafer surface. Electrical connectivity may be provided by the via formed in step S10 from the first redistribution layer and extending to the subsequently formed micro-bump and joint plate.

In some embodiments (not shown), a through-silicon via may be formed by creating a blind via, filling the blind via, and performing front side processing. Then, the blind via may be opened up by a combination of back-grinding/chemical-mechanical polishing/etching to define a through-silicon via.

The described embodiments of the invention are intended to be merely exemplary and numerous variations and modifications will be apparent to those skilled in the art. All such variations and modifications are intended to be within the scope of the present invention as defined in the appended claims. For example, the described embodiments of avoiding the CMP removal of overburden metal facets and reuse of the barrier layer are exemplary and should not in any way imply a restriction to the conditions to be used.

What is claimed is:

1. A method for forming a filled blind via, the method comprising the steps of:
   defining a blind via in a wafer;
   depositing an insulation layer over a wafer surface and in the blind via;
   forming a barrier layer comprising a first metal and a seed layer comprising a second metal over the insulation layer, the barrier layer and the seed layer extending into the blind via;
   forming a third metal layer over the barrier layer and the seed layer, filling the blind via;
   removing overburden metal facets disposed outside the blind via by electropolishing, the overburden metal facets comprising the second metal and the third metal, to expose the barrier layer disposed over the wafer surface and to define a smooth surface;
   forming a first redistribution layer over the exposed barrier layer; and
   patterning the barrier layer by removing portions of the barrier layer extending beyond the first redistribution layer.

2. The method of claim 1, wherein the blind via is defined by deep reactive ion etching.

3. The method of claim 1, wherein the insulation layer comprises a material selected from the group consisting of an oxide, a nitride and a polymer.

4. The method of claim 1, wherein the first metal is selected from the group consisting of Ti, Ta, Ti, TiN, TaN, W, WN, V, VN, Nb, and NbN.

5. The method of claim 1, wherein the second metal is selected from the group consisting of copper, tungsten, nickel, nickel boron, gold, and silver.

6. The method of claim 1, wherein the third metal layer comprises a metal selected from the group consisting of copper, tungsten, nickel, nickel boron, gold, and silver.

7. The process of claim 6, wherein forming the third metal layer comprises depositing copper by electrochemical deposition.

8. The method of claim 1, when patterning the barrier layer comprises performing a wet etch.

9. The method of claim 8, wherein the dielectric layer comprises a low K dielectric.

10. The method of claim 8, wherein the dielectric layer comprises a material selected from the group consisting of oxide, spin-on glass, and a polymer.

11. The method of claim 10, wherein forming the seed layer comprises depositing copper by physical vapor deposition.

12. The method of claim 1, further comprising forming a dielectric layer over the first redistribution layer.

13. The method of claim 1, wherein the seed layer is formed on the barrier layer prior to forming the third metal layer.

14. The method of claim 1, further comprising performing an annealing step after forming the third metal layer.

* * * * *